United States Patent
Barron

(10) Patent No.: US 8,655,418 B2
(45) Date of Patent: Feb. 18, 2014

(54) METHOD AND APPARATUS FOR A FREQUENCY DOMAIN ECHO SUPPRESSION FILTER

(75) Inventor: David Barron, Scottsdale, AZ (US)

(73) Assignee: Continental Automotive Systems, Inc, Auburn Hills, MI (US)

( * ) Notice: Subject to any disclaimer, the term of this patent is extended or adjusted under 35 U.S.C. 154(b) by 68 days.

(21) Appl. No.: 13/485,040

(22) Filed: May 31, 2012

(65) Prior Publication Data

US 2013/0324195 A1    Dec. 5, 2013

(51) Int. Cl.
  *H04B 1/38*     (2006.01)
  *H04K 3/00*     (2006.01)

(52) U.S. Cl.
  USPC ............. 455/570; 379/406.01; 381/94.1

(58) Field of Classification Search
  USPC ............. 455/569.1–569.2, 570; 379/406.01–406.12; 381/93–96
  See application file for complete search history.

(56) References Cited

U.S. PATENT DOCUMENTS

| | | | |
|---|---|---|---|
| 5,463,618 A * | 10/1995 | Furukawa et al. | 370/290 |
| 5,633,936 A * | 5/1997 | Oh | 381/66 |
| 5,937,060 A | 8/1999 | Oh | |
| 6,683,859 B1 | 1/2004 | Molnar et al. | |
| 6,925,176 B2 | 8/2005 | Myllyla et al. | |
| 8,023,641 B2 | 9/2011 | Rahbar | |
| 2004/0240664 A1 | 12/2004 | Freed | |
| 2010/0150376 A1 | 6/2010 | Itou | |

FOREIGN PATENT DOCUMENTS

| | | |
|---|---|---|
| KR | 10-0844176 B1 | 7/2008 |
| WO | 2009/029076 A1 | 3/2009 |

OTHER PUBLICATIONS

Search Report dated Oct. 15, 2012, from corresponding GB Patent Application No. GB1211136.5.

* cited by examiner

*Primary Examiner* — Lee Nguyen

(57) ABSTRACT

Residual frequency components of a reference signal are suppressed from an error signal. A magnitude of the frequency domain representation of the reference signal is divided by a magnitude of the frequency domain representation of LMS-filtered representation of the error signal to obtain a frequency domain ratio of the frequency domain representation of the reference signal to the frequency domain representation of the LMS-filtered signal. The frequency domain ratio of the frequency domain representation of the reference signal to the frequency domain representation of the LMS-filtered signal is multiplied by the frequency domain ratio of the frequency domain representation of the reference signal to the frequency domain representation of the LMS-filtered signal, to obtain a frequency domain signal having reduced residual frequency components of the reference signal.

19 Claims, 4 Drawing Sheets

METHOD AND APPARATUS FOR A FREQUENCY DOMAIN ECHO SUPPRESSION FILTER

BACKGROUND

FIG. 1 depicts an automobile or other motor vehicle 100 equipped with a hands-free cellular telephone 102, which provides two-way voice and data communication via a cellular telephone network 104. The cellular telephone 102 and the network 104 that the cell phone 102 communicates through, provide occupants of the vehicle with the ability to carry on a two-way voice conversation via a cellular telephone 105 located away from the vehicle 100.

While cellular networks are nearly ubiquitous and the communications they provide quite reliable, the audio of a "hands-free" cellular telephone continues to suffer from a phenomena known as far-end echo. In FIG. 1, voice or other audio signals 106 output from a loud speaker 108 are at an amplitude that is great enough to allow the audio signals 106 to be heard by a driver 110 or other vehicle occupants. Those audio signals are thus inherently strong enough to be sensed or "picked up" by a hands-free microphone 112 within the vehicle 100.

During a hands-free call between the cellular telephone 102 in the vehicle and the remote or "far end" cell phone 105, audio signals detected by the hands-free microphone 112 are transmitted from the cellular telephone 102 to the distant or "far end" cell phone 105. Since the audio output from the speaker 108 needs to be loud enough for the driver 110 and vehicle occupants to hear, the audio from the speaker 108 will also be picked-up by the microphone 112. Audio that is output from the speaker 108 that originates from the far end cell phone 105 will thus be picked up by the microphone 112 and sent back to the far end cell phone 105 as an "echo."

Far end audio echo, i.e., audio from a far end that is picked up at the "near end" and re-transmitted back to the far end, can be reduced by filtering the output of a hands-free phone microphone 112 at the near end of a connection, however prior art echo suppressors are unable to completely suppress far end echo. A method and apparatus for suppressing echo that remains in a signal after being LMS filtered would be an improvement.

BRIEF SUMMARY

Embodiments are directed to suppressing residual frequency components of a reference signal from an error signal. A magnitude of the frequency domain representation of the reference signal is divided by a magnitude of the frequency domain representation of LMS-filtered representation of the error signal to obtain a frequency domain ratio of the frequency domain representation of the reference signal to the frequency domain representation of the LMS-filtered signal. The frequency domain ratio of the frequency domain representation of the reference signal to the frequency domain representation of the LMS-filtered signal is multiplied by the frequency domain ratio of the frequency domain representation of the reference signal to the frequency domain representation of the LMS-filtered signal, to obtain a frequency domain signal having reduced residual frequency components of the reference signal.

DETAILED DESCRIPTION

As used herein, the term, "adaptive filter" refers to a filter that self-adjusts its transfer function according to an optimization algorithm driven by an error signal. The optimization algorithm typically operates on a signal input to the adaptive filter.

Figure 2:
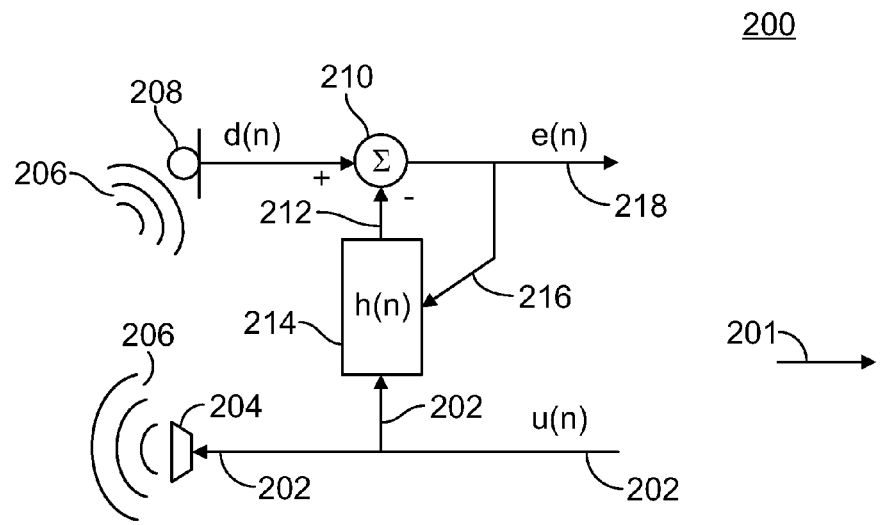
FIG. 2 block diagram of a time domain least mean squared filter (LMS)

Most adaptive filters are digital filters because the optimization algorithms are complex. Digital signal processors are frequently used to implement a digital filter but robust microcontroller and microprocessors can also implement the computations required by a digital filter. The functional devices described hereinafter are therefore preferably implemented by way of one or more computers or processors executing program instructions stored in one or more non-transitory memory devices that are accessible to the one or more computers or processors, FIG. 2 is a block diagram of a time domain, adaptive filter 200 embodied as a least mean squared or "LMS" filter. U(n) is an audio "reference signal" 202 that is received from a far end 201, typically a cellular telephone, not shown. The reference signal 202 is output from a conventional speaker 204 but at least part of the audio output from the speaker 204 is also picked up by a microphone 208. Audio signals that the microphone 208 picks up will be re-transmitted back to the far end 201 if they are not removed or at least suppressed from the microphone's output signal before they are modulated onto a radio frequency carrier.

In FIG. 2, the audio signals that are output from the microphone 208 are provided or input to a subtractor 210. The subtractor 210 removes or "subtracts" from the microphone's output signal, signals of frequencies that are determined by a time-domain adaptive filter 214, which is a filter that selectively changes its output characteristic signal 212 responsive to a control signal 216. The signal 212 that is output from the adaptive filter 214 is comprised of portions of the input signal 202 that are selected or determined by the control signal 216. The output signal 218 of the subtractor 210 is referred to herein as an error signal 218.

Figure 1:
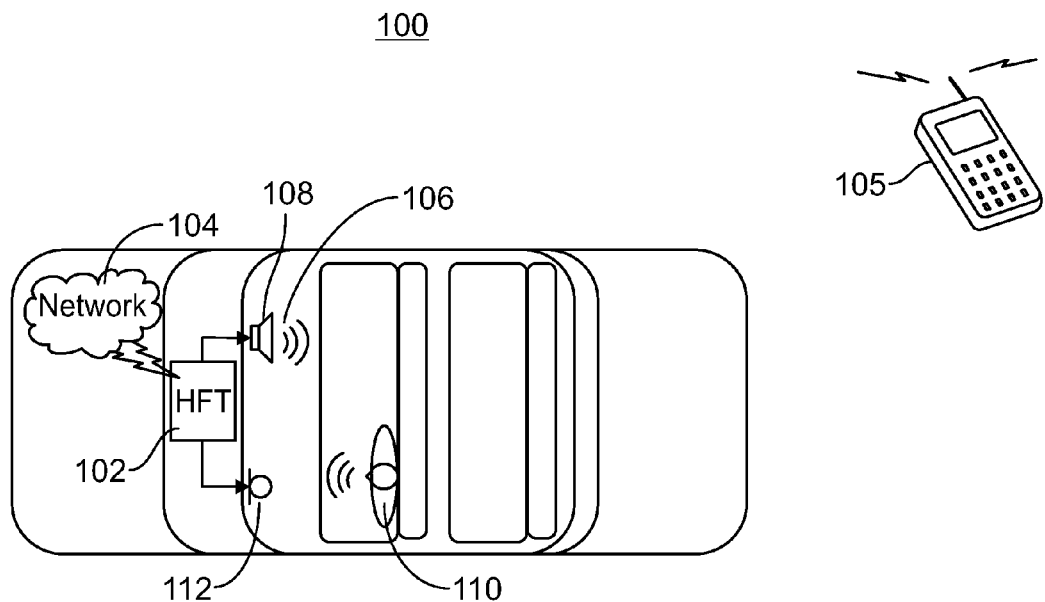
FIG. 1 is a diagram of a wireless communications system comprised of a hands-free cellular telephone.
Figure 3:
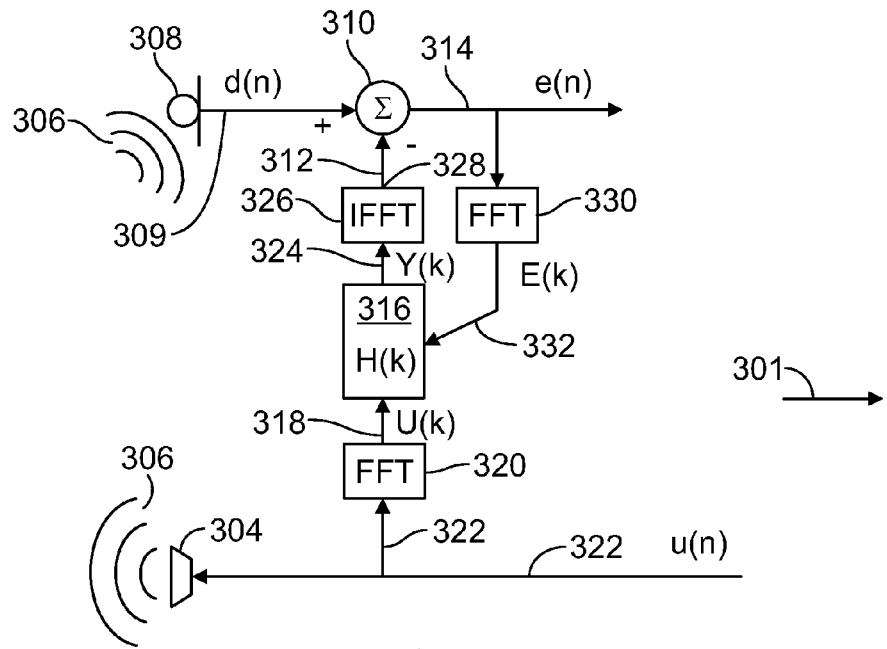
FIG. 3 is a block diagram of a frequency domain LMS filter.

FIG. 3 is a block diagram of a frequency domain least mean squared (LMS) filter 300. Its topology is similar to the time domain LMS filter depicted in FIG. 1. An audio signal 302 from a far end 301, and which is denominated as u(n), is input to a loud speaker 304 from which audio signals 306 are broadcast. Some of the signals 306 from the speaker 304 are picked up by a microphone 308.

The microphone 308 has its output signal 309 provided to a subtractor circuit 310. The subtractor 310 subtracts from the audio output signal 309, an error signal or echo estimate signal 312. The output 314 of the subtractor 310 is thus substantially similar to the audio output signal 309 from the microphone 308, albeit reduced by one or more frequency components or frequency bands of the audio signal 302 received from the far end 301.

In FIG. 3, the adaptive filter element 316 or component is a frequency domain adaptive filter. It receives a frequency domain input signal 318 that is output from a fast Fourier transformer 320 having an input 322 that receives the audio stream or signal 302 from the far end 301. Fast Fourier transforms and circuits and methods for producing them are well known in the art. A description of them is omitted for brevity.

The output 324 of the frequency domain adaptive filter 316 is provided to an inverse fast Fourier transformer 326, the output of which 328 is a time domain or time-varying signal that forms the echo estimation signal 312 that is input to the subtractor 310.

FIG. 3 also shows a second fast Fourier transformer 330 which receives the output signal 314 of a subtractor 310. The second fast Fourier transformer 330 provides an input signal 332 to the frequency domain adaptive filter 316 representative of the spectral content of the output signal 314 from the subtractor 310. That spectral content 332 controls the frequency domain adaptive filter 316 to control or cause the filter 316 to produce in its output signal 324, audio frequency spectral components, which when returned to the time domain and then subtracted from the time domain signal 309 of the microphone 308, reduce or eliminate those same spectral components from the output signal 314 of the subtractor 310. The frequency domain LMS filter 300 of FIG. 3 thus selectively reduces from the audio signal 309 of the microphone 308 various spectral regions or spectral components that originate from or are produced by audio signals 306 output from the speaker 304, and which originated from the far end 301, such as a cellular telephone.

Unfortunately, audio signals 306 emanating from the speaker 304 and which are picked up by the microphone 308 are not removed completely from the signal 314 output from the subtractor 310. Some echo residual signal will frequently be found in the audio output signal 314 from the subtractor. When that signal is sent to the far end 301, a user at the far end 301 will hear a portion of his voice as an echo, which can be annoying.

Figure 4:
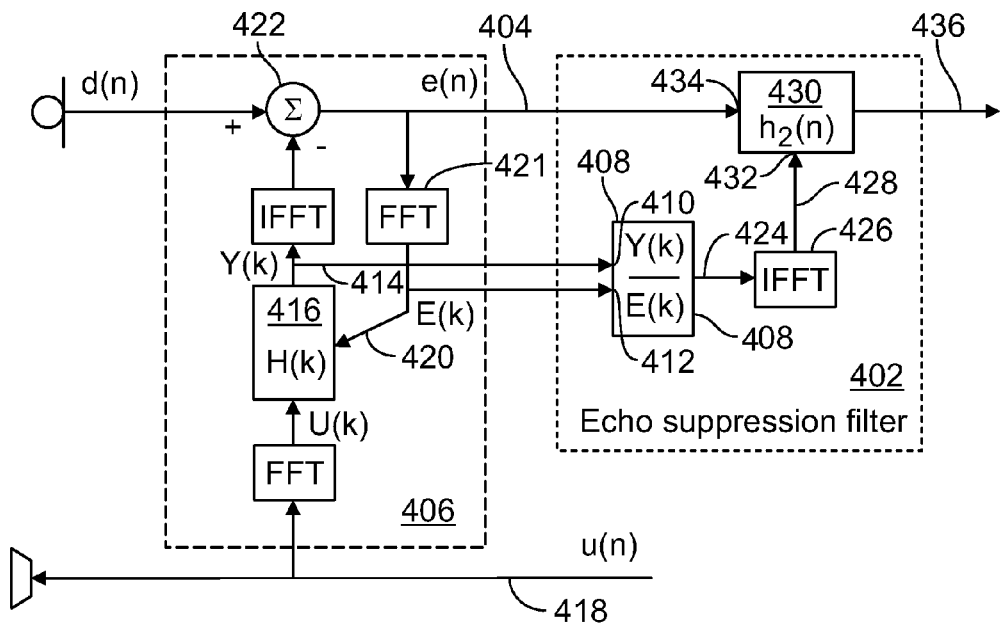
FIG. 4 is a block diagram of an apparatus and method for providing frequency domain echo suppression.

FIG. 4 is a block diagram of an apparatus 400 for suppressing echo in a frequency domain signal. The apparatus 400 is comprised of an echo suppression filter 402 that receives a time domain signal 404 from an LMS filter 406 that is similar to the LMS filter 300 shown in FIG. 3.

The echo suppression filter 402 is comprised of a frequency domain divider 408 having two signal input ports 410 and 412. The divider 408 receives at a first input 410, a frequency domain representation 414 of a "reference signal" that is output from a frequency domain adaptive filter 416. The adaptive filter 416 comprises part of the LMS filter 406. The reference signal 414 is a filtered frequency domain estimate of an audio signal 418 that is received from a far end 401 of a communications network, not shown.

A second input 412 of the divider 408 receives an error signal 420. The error signal 420 is a frequency domain copy or representation of the uplink signal 404 which is the output of a fast Fourier transformer 421 that converts the time domain representation of the output of the subtractor device 422 to the frequency domain. The divider 408, which is a frequency domain divider, divides the magnitude of the frequency domain representation of the reference signal 414 by the magnitude of the frequency domain representation of the error signal 420. It produces a frequency domain output signal 424, which is a frequency domain ratio signal 424. The frequency domain ratio signal 424 represents components of the audio signal 418 from the far end 401 that remain in the signal 404 output from the subtractor 422.

The output signal 424 of the frequency domain divider 408 is input to a frequency domain-to-time domain converter 426. The converter 426 is preferably embodied as an inverse fast Fourier transformer (IFFT) 426, which produces as an output, a time domain filter coefficient signal 428.

The time domain filter coefficient signal 428 is input a first input port 432 of a time domain adaptive filter 430. The error signal 404, which is the output of the substractor 424, is into to a second input port 434 of the time domain adaptive filter 430.

The time domain adaptive filter 430 multiplies the error signal 404 by the filter coefficient signal 428. This multiplication is performed by a conventional, prior art convolution of the error signal 404 by the filter coefficient signal 428. The output 436 of the time domain adaptive filter 430 is thus in the time domain, i.e., a conventional audio signal 436, the frequency components of which are devoid or substantially devoid of frequency components found in the audio signal 418 received from the far end 401. Audio echo that would be evident in the time domain is thus suppressed or eliminated by operations in the frequency domain.

Those of ordinary skill in the art will recognize that it is computationally difficult to perform a convolution of the error signal 404 by the filter coefficient signal 428. It is simpler and faster to perform such an operation in the frequency domain.

Figure 5:
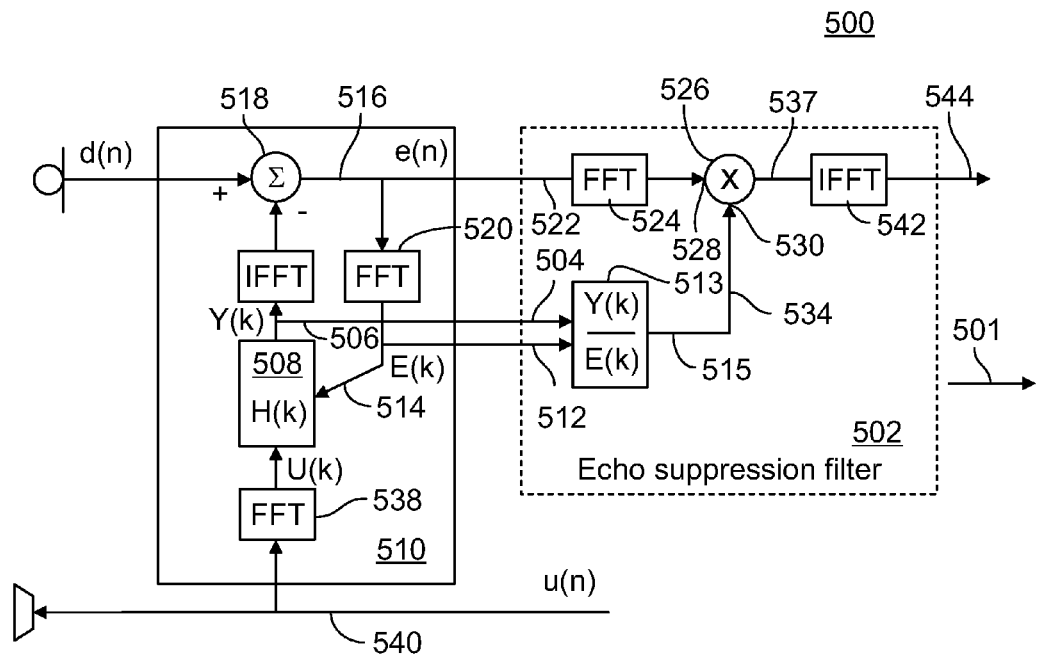
FIG. 5 is a block diagram of another apparatus and method for providing frequency domain echo suppression.

FIG. 5 depicts a second and preferred embodiment of a method and apparatus for frequency domain echo suppression. An echo suppression filter 502 is configured and arranged to operate in the frequency domain. The echo suppression filter 502 has three inputs. A first input 504 receives a frequency domain reference signal 506 from a frequency domain adaptive filter 508, which forms part of a frequency domain LMS filter 510.

A second input 512 of the echo suppression filter 502 receives an error signal 514 that is a frequency domain representation of the audio signal 516 that is output from a time-domain subtractor circuit 518. The error signal 514 is obtained by performing a fast Fourier transform 520 on the error signal 516. Signals received at the two inputs 504 and 512 are provided to a frequency domain divider 513, the output signal 515 of which is a frequency domain ratio of signals received at the two inputs 504 and 512.

A third input 522 to the echo suppression filter 502 receives the time domain representation of the error signal. A fast Fourier transformer 524 in the echo suppression filter 502, but which could also be external to the filter 502, such as between the echo suppression filter 502 and the LMS filter 510, converts the time domain error signal 542 to the frequency domain and provides the frequency domain representation of the error signal 542 to a frequency domain multiplier 526.

The frequency domain multiplier 526 has two inputs: 528 and 530. A first input 528 receives the frequency domain representation of the error signal 516. The second input 530 receives output of a frequency domain divider 532. The divider 513 computes a frequency domain division or quotient of the magnitude of the frequency domain representation of the reference signal by the magnitude of the frequency domain representation of the error signal 514. The output of the divider 513 is a frequency domain signal 515 that is a representation of the ratio of those two frequency domain signals. The output signal 515 is multiplied in the multiplier 526 by the frequency domain representation of the error signal 522, to produce a frequency domain output signal 537 the frequency components of which are devoid or substantially devoid of the frequency components found in the original audio signal 540 received from the far end 501.

Figure 6:
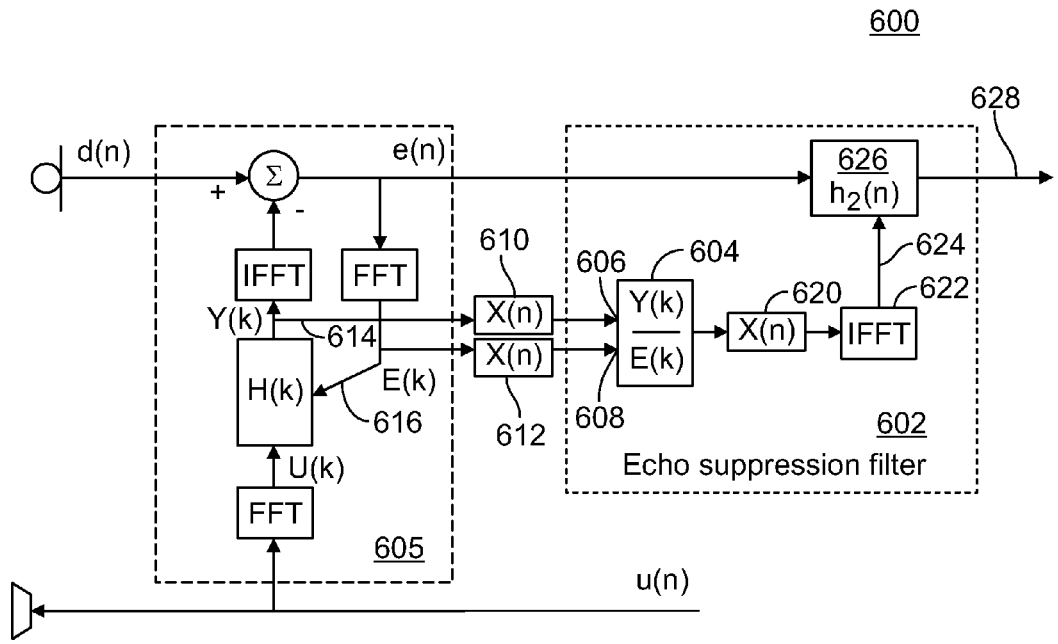
FIG. 6 is a block diagram of another apparatus and method for providing frequency domain echo suppression and which provides scaling of frequency components.

FIG. 6 is another embodiment of a method and apparatus for frequency domain echo suppression. The apparatus shown in FIG. 6 has a frequency domain echo suppression filter 602 comprised of a frequency domain divider 604 with two inputs 606 and 608. The apparatus 600 shown in FIG. 5 differs from the apparatus shown in FIG. 4 as well as FIG. 5 by the use of one or more optional scalers 610 and 612, which can be either multipliers or dividers, which operate on the frequency domain representations of the error signal 614 and/or the reference signal 612 before they are input to the divider 604.

As their names suggest, the scalers 610 and 612 are configured to be able to multiply or divide, i.e. "scale," one or more frequency bands or portions of the frequency spectrum found in the frequency domain signals embodied as the error signal 614 and the reference signal 612. Their scaling factors are controllable however. Individual specific bands frequencies can be amplified or attenuated by different amounts or factors. By scaling one or more different frequency bands differently from others, the subsequent division by the frequency domain divider 604 can selectively amplify or suppress different frequency bands that might be required by different applications for a frequency domain echo suppresser.

FIG. 6 depicts another scaler 620 on the output side of the frequency domain divider 604. This third scaler 620, which is also optional, can selectively scale different frequency bands or elements output from the divider 604. Converting those scaled frequency domain signals to the time domain by the inverse fast Fourier transformer 622 produces a coefficient signal 624 that is applied to an adaptive time domain filter 626. By changing the filter coefficients signal using one or more of the scalers 610, 612, and 620, the output of the time domain adaptive filter 622 can be tailored to selectively suppress or amplify different components of an audio frequency spectrum.

Those of ordinary skill in the art should understand that the use of scalers as depicted in FIG. 6 can also be used with the all-frequency domain method and apparatus depicted in FIGS. 4 and 5. Repetition of the depiction of the scalers 610, 612, and 616 is therefore omitted from the embodiment depicted in FIG. 5 for brevity.

Figure 7:
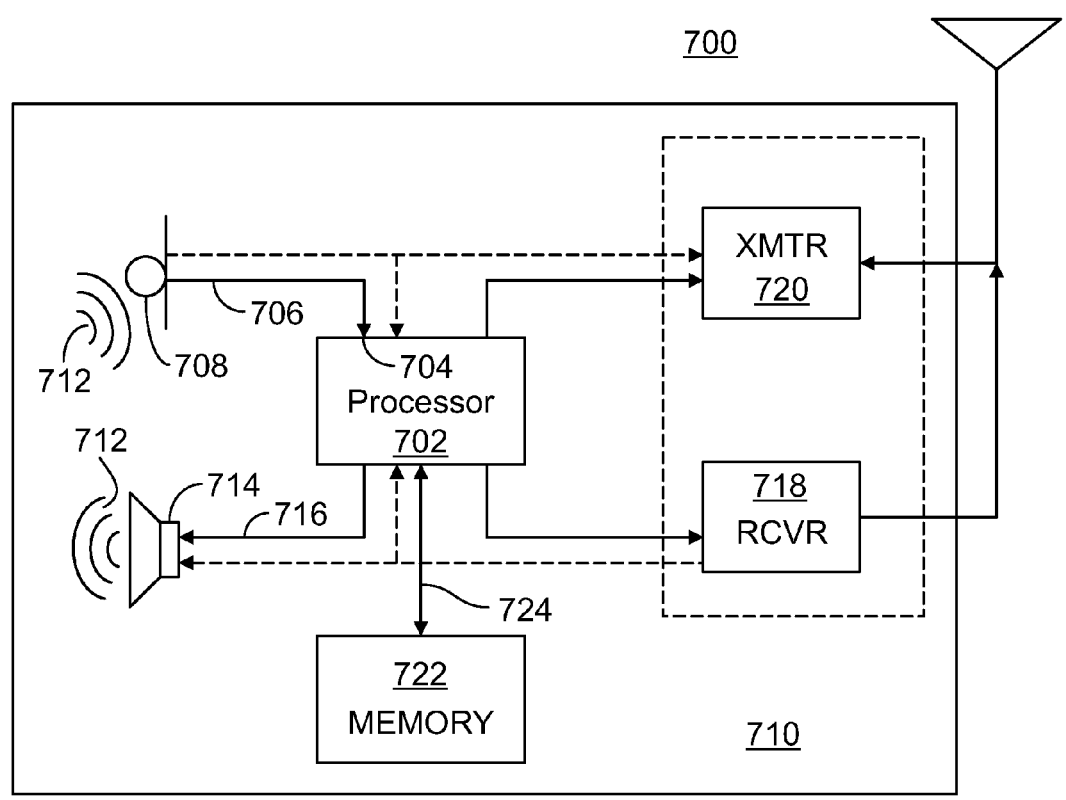
FIG. 7 is a block diagram of an implementation of an apparatus for providing frequency domain echo suppression.

FIG. 7 depicts one implementation of an apparatus for performing frequency domain echo suppression using a conventional microcontroller or microprocessor. In FIG. 7, a conventional processor 702 with I/O peripheral devices on the same semiconductor die, has an audio input port 704 coupled to receive audio signals 706 from a microphone 708. The microphone 708, being a hand-free microphone, is positioned as would be necessary in a vehicle, such as the one depicted in FIG. 1, and where it would be able to pick up audio signals 712 output from a loud speaker or other audio transducer 714. (The audio signals 716 sent to the speaker 714 are depicted as coming from the processor 702 but could just as easily be obtained from the radio frequency receiver 718. Similarly, the audio signals 706 detected by the microphone 708 can be provided directly to the transmitter as well as the processor 702.

The processor 702 is coupled to a memory device that is non transitory, i.e. it stores and is capable of being rewritten with program instructions that can be executed by the processor 702. The memory 722 is coupled to the processor through a conventional address/data/control bus 724.

Executable program instructions in the memory 722 imbue the processor 702 with the ability to perform the functions described above. More particularly, those instructions imbue the processor with the ability to generate frequency domain representations of audio signals, divide and multiple frequency domain representations of two or more audio signals and to convert frequency domain representations of signals to the time domain. Those instructions also imbue the processor 702 with the ability to suppress frequency components of a reference signal that are found in the error signal.

By providing a frequency domain echo suppression filter such as the filters depicted in FIGS. 4, 5, and 6 at the output side of a prior art LMS frequency domain echo suppressor improved audio quality can be realized over the prior art. The forgoing descriptions are for purposes of illustration only. The true scope of the invention is defined by the following claims.

The invention claimed is:

1. A method of suppressing residual frequency components of a reference signal, from a least-mean-squared (LMS) filtered signal carrying said residual frequency components of the reference signal, the method comprising:
  dividing a magnitude of the frequency domain representation of the reference signal by a magnitude of the frequency domain representation of the LMS-filtered signal to obtain a frequency domain ratio of the frequency domain representation of the reference signal to the frequency domain representation of the LMS-filtered signal; and
  multiplying the frequency domain representation of the LMS-filtered signal by the frequency domain ratio of the frequency domain representation of the reference signal to the frequency domain representation of the LMS-filtered signal, to obtain a frequency domain signal having reduced residual frequency components of the reference signal.

2. The method of claim 1, further comprising the step of converting the frequency domain signal having reduced residual frequency components of the reference signal to the time domain.

3. The method of claim 1, further comprising the step of scaling at least one of: the frequency domain representation of the reference signal, the frequency domain of the LMS-filtered signal, and the frequency domain ratio of the frequency domain representation of the reference signal to the frequency domain representation of the LMS-filtered signal.

4. The method of claim 1, wherein the reference signal is an audio signal that was carried over a wireless communications network and output from an audio transducer, and wherein the LMS-filtered signal is an audio signal output from an audio signal detector, the audio signal from the audio signal detector being comprised of the reference signal and a voice signal.

5. The method of claim 4, wherein the audio transducer is a Hands-free telephone speaker and wherein the audio signal detector is the hands-free telephone microphone.

6. An apparatus for suppressing residual echo signals from a time domain error signal output from a least-mean-squared frequency domain filter, the apparatus comprising:
  a frequency domain divider, configured to divide a magnitude of the frequency domain representation of a reference signal, by a magnitude of the frequency domain representation of the error signal, the divider being additionally configured to provide a frequency domain representation of the ratio of the frequency domain representation of the reference signal to the frequency domain representation of the error signal; and
  a frequency domain multiplier configured to multiply the frequency domain version error signal by the ratio of the frequency domain representation of the reference signal to the frequency domain representation of the error signal.

7. The apparatus of claim 6, further comprising a frequency domain to time domain converter configured to receive the output of the frequency domain multiplier and to output a time domain signal comprised substantially of the error signal reduced by reference signal.

8. The apparatus of claim 7, further comprising a scaler configured to scale at least one of: the frequency domain representation of the reference signal, the frequency domain of the LMS-filtered signal, and the frequency domain ratio of the frequency domain representation of the reference signal to the frequency domain representation of the LMS-filtered signal.

9. The apparatus of claim 8, further comprising:
an audio transducer configured to receive the reference signal and to generate an audible signal therefrom; and
an audio signal detector configured to be able to detect the audible signal from the audio transducer and to generate an error signal output that is comprised of the reference signal and a voice signal.

10. The apparatus of claim 7, wherein the frequency domain divider and the frequency domain multiplier are comprised of:
a processor; and
at least one memory device storing program instructions, which when executed cause the processor to:
divide a magnitude of the frequency domain representation of a reference signal, by a magnitude of the frequency domain representation of the error signal, the divider being additionally configured to provide a frequency domain representation of the ratio of the frequency domain representation of the reference signal to the frequency domain representation of the error signal; and
multiply the frequency domain version error signal by the ratio of the frequency domain representation of the reference signal to the frequency domain representation of the error signal.

11. A method of suppressing residual frequency components of a reference signal, from a least-mean-squared (LMS) filtered signal carrying said residual frequency components of the reference signal, the method comprising:
dividing a magnitude of the frequency domain representation of the reference signal by a magnitude of the frequency domain representation of the LMS-filtered signal to obtain a frequency domain ratio of the frequency domain representation of the reference signal to the frequency domain representation of the LMS-filtered signal; and
converting to the time domain, the frequency domain ratio of the frequency domain representation of the reference signal to the frequency domain representation of the LMS-filtered signal to produce a time domain, filter coefficient signal; and
providing the time domain filter coefficient signal to a time domain, frequency-component suppressing filter that is configured to receive the LMS-filtered signal as an input and to produce an echo suppressed output, responsive to the time domain filter coefficient signal.

12. The method of claim 11, wherein the step of providing the time domain filter coefficient signal to a time domain frequency-component suppressing filter is further comprised of the convolution of the LMS-filtered signal by the time domain filter coefficient signal and wherein the echo-suppressed output is a time domain signal comprised of the LMS-filtered signal reduced by the reference signal.

13. The method of claim 12, further comprising the step of scaling at least one of: the frequency domain representation of the reference signal, the frequency domain of the LMS-filtered signal, and the frequency domain ratio of the frequency domain representation of the reference signal to the frequency domain representation of the LMS-filtered signal.

14. The method of claim 12, wherein the reference signal is an audio signal that was carried over a wireless communications network and output from an audio transducer, and wherein the LMS-filtered signal is an audio signal output from an audio signal detector, the audio signal from the audio signal detector being comprised of the reference signal and a voice signal.

15. The method of claim 14, wherein the audio transducer is a cellular telephone speaker and wherein the audio signal detector is the cellular telephone microphone.

16. An apparatus for suppressing residual echo signals from a time domain error signal provided by a least-mean-squared frequency domain filter, the apparatus comprising:
a frequency domain divider, configured to divide a frequency domain representation of a reference signal, by a frequency domain representation of the error signal, the frequency domain divider being additionally configured to provide a frequency domain ratio signal;
a converter configure to convert a frequency domain signal to a time domain signal, the converter being coupled to the frequency domain divider and additionally configured to produce as an output, a time domain, filter coefficient filter signal; and
a time domain filter having a first input configured to receive the error signal, a second input configured to receive the filter coefficient signal from the converter and having an output, the time domain filter configured to suppress frequency components of the reference signal that are in the error signal.

17. The apparatus of claim 16, further comprising a scaler configured to scale at least one of: the frequency domain representation of the reference signal, the frequency domain of the LMS-filtered signal, and the frequency domain ratio of the frequency domain representation of the reference signal to the frequency domain representation of the LMS-filtered signal.

18. The apparatus of claim 16, further comprising:
an audio transducer configured to receive the reference signal and to generate an audible signal therefrom; and
an audio signal detector configured to be able to detect the audible signal from the audio transducer and to generate an error signal output that is comprised of the reference signal and a voice signal.

19. The apparatus of claim 16, wherein the frequency domain divider, converter and the frequency domain multiplier are comprised of:
a processor; and
at least one memory device storing program instructions, which when executed cause the processor to:
divide a magnitude of the frequency domain representation of a reference signal, by a magnitude of the frequency domain representation of the error signal, the divider being additionally configured to provide a frequency domain representation of the ratio of the frequency domain representation of the reference signal to the frequency domain representation of the error signal;
convert a frequency domain signal to a time domain signal, the converter being coupled to the frequency domain divider and additionally configured to produce as an output, a time domain, filter coefficient filter signal; and multiply the frequency domain version error signal by the ratio of the frequency domain representation of the reference signal to the frequency domain representation of the error signal.

* * * * *